(12) United States Patent
Kusumi et al.

(10) Patent No.: US 6,677,203 B2
(45) Date of Patent: Jan. 13, 2004

(54) METHOD OF MANUFACTURING A SEMICONDUCTOR MEMORY DEVICE WHICH REDUCES THE MINIMUM AREA REQUIREMENTS OF THE DEVICE

(75) Inventors: Masataka Kusumi, Osaka (JP); Seiki Ogura, New York, NY (US)

(73) Assignees: Matsushita Electric Industrial Co., Ltd., Osaka (JP); Halo LSI Design and Device Technologies Inc., Wappingers Falls, NY (US)

( * ) Notice: Subject to any disclaimer, the term of this patent is extended or adjusted under 35 U.S.C. 154(b) by 0 days.

(21) Appl. No.: 09/964,521

(22) Filed: Sep. 28, 2001

(65) Prior Publication Data

US 2002/0039823 A1 Apr. 4, 2002

(30) Foreign Application Priority Data

Sep. 29, 2000 (JP) ........................................ 2000-298306

(51) Int. Cl.[7] ............................................. H01L 21/336
(52) U.S. Cl. ...................................................... 438/267
(58) Field of Search ........................................ 438/267

(56) References Cited

U.S. PATENT DOCUMENTS 5,780,341 A 7/1998 Ogura

| | | | |
|---|---|---|---|
| 6,051,860 A | * | 4/2000 | Odanaka et al. ............ 257/316 |
| 6,074,914 A | * | 6/2000 | Ogura ........................ 438/257 |
| 6,303,438 B1 | * | 10/2001 | Hori et al. ................. 438/257 |

FOREIGN PATENT DOCUMENTS

JP 11-26731 1/1999

* cited by examiner

Primary Examiner—Wael Fahmy
Assistant Examiner—Howard Weiss
(74) Attorney, Agent, or Firm—McDermott, Will & Emery

(57) ABSTRACT

A semiconductor memory device according to the present invention includes isolations, active regions, control gate electrodes and floating gate electrodes. The isolations are formed on a semiconductor substrate. The active regions are defined on the semiconductor substrate and isolated from each other by the isolations. The control gate electrodes are formed over the semiconductor substrate. Each of the control gate electrodes crosses all of the isolations and all of the active regions with a first insulating film interposed between the control gate electrode and the semiconductor substrate. Each of the floating gate electrodes is formed for associated one of the active regions so as to cover a side face of associated one of the control gate electrodes with a second insulating film interposed between the floating gate electrode and the control gate electrodes. In this device, the isolations are spaced apart from each other along the width of the control gate electrodes and each of the isolations crosses all of the control gate electrodes and extends continuously along the length of the control gate electrodes.

5 Claims, 19 Drawing Sheets

METHOD OF MANUFACTURING A SEMICONDUCTOR MEMORY DEVICE WHICH REDUCES THE MINIMUM AREA REQUIREMENTS OF THE DEVICE

BACKGROUND OF THE INVENTION

The present invention relates to a semiconductor memory device and a method for fabricating the device, and more particularly relates to a nonvolatile semiconductor memory device of which the floating gate electrode is formed on a side face of the control gate electrode thereof and a method for fabricating the device.

Flash EEPROM (Electrically Erasable Programmable ROM) devices are well known as electrically erasable and programmable nonvolatile memory devices.

Recently, U.S. Pat. No. 5,780,341 disclosed a memory cell structure for a flash EEPROM semiconductor memory device, which includes: a step region formed in the drain region thereof; a floating gate electrode formed so as to overlap with the step region; and a control gate electrode adjacent to the floating gate electrode. In this memory cell, channel hot electrons are created by applying a voltage to the drain region and the control gate electrode. Then, a write operation is carried out by injecting the created hot electrons into the floating gate electrode located over the step region, i.e., in the direction in which the electrons move.

Hereinafter, the known semiconductor memory device including the step region in its drain region will be described with reference to the accompanying drawings.

FIGS. 10A, 10B and 10C illustrate a structure for the known semiconductor memory device. FIG. 10A illustrates a planar layout of the device. FIG. 10B illustrates a cross-sectional structure for part of the device including an active region. FIG. 10C illustrates a cross-sectional structure for part of the device including an isolation film.

As shown in FIGS. 10A, 10B and 10C, multiple control gate electrodes 104 are formed over a semiconductor substrate 101 made of silicon with a gate insulating film 103 interposed between the electrodes 104 and the substrate 101. Multiple shallow trench isolations (STIs) 102 are also formed on the substrate 101 so as to be spaced apart from each other in the direction in which the control gate electrodes 104 extend, i.e., in the width direction of the control gate electrodes 104. Each of the STIs 102 crosses with associated ones of the control gate electrodes 104.

On a side face of each of the control gate electrodes 104, a floating gate electrode 106 is formed with an insulating film 105, which will be a capacitance insulating film and a tunnel insulating film, interposed between the floating gate electrode 106 and the control gate electrode 104. The floating gate electrode 106 is located in an active region between adjacent ones of the STIs 102 on the semiconductor substrate 101.

As shown in FIG. 10B, a step region 101a exists in part of the active region under each floating gate electrode 106. Also, a drain region 107 has been defined in another part of the active region closer to the floating gate electrode 106 and a source region 108 has been defined in still another part of the active region opposite to the floating gate electrode 106.

As shown in FIGS. 10B and 10c, the drain region 107 extends continuously in the gate width direction of the control gate electrode 104. In this manner, in the known semiconductor memory device, the drain region 107 is shared between multiple cells and thus a drain line can be formed on the semiconductor substrate 101. Accordingly, it is not necessary to form an additional drain line over the semiconductor substrate 101 with contacts interposed between the drain line and the substrate. Thus, the number of contacts needed can be reduced. As a result, the proportion of the contacts to the total cell area can be reduced, thus contributing to the downsizing of the device.

Hereinafter, a method for fabricating the known semiconductor memory device will be described with reference to the accompanying drawings.

FIGS. 11A through 17C illustrate respective process steps for fabricating the known semiconductor memory device. In each of these drawings, A illustrates a planar layout of the structure, B illustrates a cross-sectional structure including an active region and C illustrates a cross-sectional structure including STIs.

First, as shown in FIGS. 11A, 11B and 11C, multiple slip-shaped STIs 202 are formed on a semiconductor substrate 201 of silicon so as to be spaced apart from each other.

Next, as shown in FIGS. 12A, 12B and 12C, the exposed surface of the semiconductor substrate 201 is thermally oxidized, thereby forming a first silicon dioxide film on the semiconductor substrate 201. Then, a first polysilicon film and a first insulating film 205 are deposited in this order on the first silicon dioxide film by a CVD process. Then, a mask pattern 206 for forming control gate electrodes is defined by a photolithographic process, and the first insulating film 205, the first polysilicon film and the first silicon dioxide film are dry-etched using the mask pattern 206. In this manner, control gate electrodes 204 are formed out of the first polysilicon film and control gate insulating films 203 are formed out of the first silicon dioxide film.

Next, as shown in FIGS. 13A, 13B and 13C, after the mask pattern 206 has been removed, a second insulating film is deposited over the semiconductor substrate 201 by a CVD process. Then, the second insulating film is dry-etched, thereby forming sidewall insulating films 207 out of the second insulating film on the side faces of the control gate electrodes 204.

Next, as shown in FIGS. 14A, 14B and 14C, a mask pattern 208, which has an opening over part of the active region of the semiconductor substrate 201 where the drain region will be defined, is defined over the substrate 201 for purpose of forming the step regions by a photolithographic process. Then, the step regions 201a are defined in the drain forming region of the semiconductor substrate 201 by a dry etching process using the mask pattern 208, first insulating films 205 and sidewall insulating films 207 as a mask.

Then, as shown in FIGS. 15A, 15B and 15C, after the mask pattern 208 has been removed, the sidewall insulating films 207 are removed by a wet etching process. Subsequently, the side faces of the control gate electrodes 204 and the step regions 201a are thermally oxidized, thereby forming a second silicon dioxide film 209 which will be a capacitance insulating film and a tunnel insulating film. Then, a second polysilicon film 210A is deposited on the second silicon dioxide film 209 by a CVD process. Thereafter, a mask pattern 211, which has an opening over the drain forming region to extend in the gate width direction of the control gate electrodes 204, is defined on the second polysilicon film 210A by a photolithographic process. Then, the second polysilicon film 210A is dry-etched using the mask pattern 211 and the first insulating films 205 as a mask, thereby forming sidewall-shaped polysilicon films 210B out of the second polysilicon film 210A.

Subsequently, as shown in FIGS. 16A, 16B and 16C, after the mask pattern 211 has been removed, a mask pattern 212 is defined by a photolithographic process to mask the drain forming regions of the semiconductor substrate 201 and sidewall-shaped polysilicon films 210B. Then, the second poly-silicon film 210A and the sidewall-shaped polysilicon films 210B are dry-etched using the mask pattern 212 and the first insulating films 205 as a mask, thereby forming island-shaped floating gate electrodes 210C, overlapping the step regions 201a, out of the sidewall-shaped polysilicon films 210B in the drain forming regions.

Next, as shown in FIGS. 17A, 17B and 17C, after the mask pattern 212 has been removed, arsenic ions are implanted using the first insulating films 205 and the floating gate electrodes 210C as a mask. In this manner, drain regions 214 are defined in the drain forming regions and source regions 215 are defined in the source forming regions.

The known fabrication process, however, has the following two problems.

First, when the second polysilicon film 210A and those parts of the sidewall-shaped polysilicon films 210B located over the STIs 202 are removed using the mask pattern 212 shown in FIGS. 16A and 16B, an anisotropic etching process is carried out to obtain the floating gate electrodes 210C in good shape out of the sidewall-shaped polysilicon films 210B. In this case, the upper face of the second polysilicon film 210A on the STIs 202 has a height of approximately 450 nm, when the thicknesses of the control gate electrodes 204, the first insulating films 205 and the second polysilicon film 210A are 200 nm, 150 nm and 100 nm, respectively, as shown in FIG. 15. When the second polysilicon film 210A is etched away, the etch selectivity of this second polysilicon film 210A to the second silicon dioxide film 209 is approximately 40. Accordingly, the second silicon dioxide film 209, which is exposed in the regions identified by the reference numeral 201b in FIGS. 18A and 18C and has a thickness of 9 nm, partially breaks. As a result, the semiconductor substrate 201 is etched unintentionally and part of the doped layer located between the STIs 202 disconnects.

Another problem relates to the mask pattern 212 shown in FIG. 16A for masking the drain forming regions of the substrate and sidewall-shaped polysilicon films 210B. Specifically, the mask pattern 212 actually formed often has its corner rounded like the mask pattern 212A shown in FIG. 19, thus possibly deteriorating the resultant size accuracy. To avoid such an unfavorable situation, a size of the mask pattern should be allowed a relatively great margin. As a result, each of the STIs 202 should have its size increased in the gate width direction of the control gate electrodes 204, and therefore the area of each cell cannot be reduced.

SUMMARY OF THE INVENTION

A first object of the present invention is to keep the doped regions from being disconnected.

A second object of the present invention is to reduce the total area of a memory cell.

In order to achieve the first object, according to this invention, isolations with a continuous striped pattern are formed for respective memory cells. Also, to achieve the second object, according to an inventive method for fabricating a semiconductor memory device, the unnecessary parts of the second conductive film to be the floating gate electrodes are not removed at a time from over the isolations and the source-to-be regions. Instead, those excessive parts of the second conductive film are removed from over the isolations first and then the remaining parts of the second conductive film are removed from over the source-to-be regions.

Specifically, to achieve the first object, a semiconductor memory device according to the present invention includes isolations, active regions, control gate electrodes and floating gate electrodes. The isolations are formed on a semiconductor substrate. The active regions are defined on the semiconductor substrate and isolated from each other by the isolations. The control gate electrodes are formed over the semiconductor substrate. Each of the control gate electrodes crosses all of the isolations and all of the active regions with a first insulating film interposed between the control gate electrode and the semiconductor substrate. Each of the floating gate electrodes is formed for associated one of the active regions so as to cover a side face of associated one of the control gate electrodes with a second insulating film interposed between the floating gate electrode and the control gate electrodes. In this device, the isolations are spaced apart from each other along the width of the control gate electrodes and each of the isolations crosses all of the control gate electrodes and extends continuously along the length of the control gate electrodes.

In the inventive semiconductor memory device, the isolations are spaced apart from each other along the width of the control gate electrodes. Each of the isolations crosses all of the control gate electrodes and extends continuously along the length of the control gate electrodes. Accordingly, when an etching process is carried out to form the floating gate electrodes, the semiconductor substrate is no longer etched unintentionally. Therefore, no doped regions are disconnected.

In one embodiment of this invention, the inventive memory device may further include a third insulating film formed on each of the control gate electrodes.

In another embodiment, each of the active regions may have a plurality of step regions, each of which may be overlapped by associated one of the floating gate electrodes. In each of the active regions, source regions may be defined in respective upper parts of the step regions and a drain region may be defined below the step region. Then, channel hot electrons, created during a writing operation, can be injected into the floating gate electrodes much more efficiently.

To achieve the second object, an inventive method for fabricating a semiconductor memory device includes the step of a) forming a plurality of isolations on a semiconductor substrate, thereby defining a plurality of active regions, which have been isolated from each other by the isolations, on the semiconductor substrate. The method further includes the step of b) forming a first insulating film and a first conductive film in this order over the semiconductor substrate and then selectively etching the first conductive film, thereby forming a control gate electrode out of the first conductive film so that the control gate electrode crosses all of the isolations and all of the active regions. The method further includes the step of c) forming a second insulating film and a second conductive film in this order over the semiconductor substrate as well as over the isolations and the control gate electrode and then selectively etching parts of the second conductive film, thereby forming floating gate electrodes out of the second conductive film for the active regions so that the floating gate electrodes cover a side face of the control gate electrode. And the method further includes the step of d) implanting ions into the semiconductor substrate using the control gate electrode and the floating gate electrodes as a mask, thereby defining source and drain regions in each said active region. In this method, the step c) includes: forming and selectively etching the second conductive film to form a sidewall-shaped conductive film out of the second conductive film on the side face of the control gate electrode; removing parts of the sidewall-shaped conductive film and parts of the second conductive film from over the isolations; and removing remaining parts of the second conductive film from upper and another side faces of the control gate electrode, thereby forming the floating gate electrodes as islands out of the sidewall-shaped conductive film on the side of the control gate electrode.

In the inventive method, when the excessive parts of the sidewall-shaped conductive film and the second conductive film are etched away from over the isolations in the step c), the active regions and the members located over the active regions can be masked continuously in the gate length direction. Thus, the mask pattern does not have to consist of the known isolated elements. Therefore, there is no need to worry about the rounding at the corners of the isolated pattern elements. Thus, a margin that should be allowed for the mask pattern can be reduced. As a result, each of the isolations can have its size reduced in the gate width direction of the control gate electrode, and therefore the area of each cell can be reduced. Accordingly, the memory cells can have their size reduced and can be integrated much more densely.

In one embodiment of this invention, the step a) may include forming the isolations in a striped pattern on the semiconductor substrate so that the isolations are spaced apart from each other along the width of the control gate electrode. Then, the first object can also be achieved, and therefore no doped regions are disconnected between adjacent ones of the isolations.

In another embodiment, the step b) may include forming a third insulating film on the first conductive film and then etching the third insulating film and the first conductive film. Then, in the etching process step for forming the floating gate electrodes out of the second conductive film, the upper face of the control gate electrode that has been formed out of the first conductive film can be protected as intended by the third insulating film that covers the control gate electrodes.

In still another embodiment, the step c) may include forming a sidewall insulating film on side faces of the control gate electrode with the second insulating film interposed between the sidewall insulating film and the control gate electrode. The step c) may further include etching parts of the semiconductor substrate, which parts are located below the side face of the control gate electrode, using the sidewall insulating film as a mask, thereby forming a plurality of step regions for the active regions.

BRIEF DESCRIPTION OF THE DRAWINGS

FIG. 2A is a partial plan view; FIG. 2B is a cross-sectional view taken along the line IIb—IIb shown in FIG. 2A; and FIG. 2C is a cross-sectional view taken along the line IIc—IIc shown in FIG. 2A.

FIG. 3A is a partial plan view; FIG. 3B is a cross-sectional view taken along the line IIIb—IIIb shown in FIG. 3A; and FIG. 3C is a cross-sectional view taken along the line IIIc—IIIc shown in FIG. 3A.

FIG. 4A is a partial plan view; FIG. 4B is a cross-sectional view taken along the line IVb—IVb shown in FIG. 4A; and FIG. 4C is a cross-sectional view taken along the line IVc—IVc shown in FIG. 4A.

FIG. 5A is a partial plan view; FIG. 5B is a cross-sectional view taken along the line Vb—Vb shown in FIG. 5A; and FIG. 5C is a cross-sectional view taken along the line Vc—Vc shown in FIG. 5A.

FIG. 6A is a partial plan view; FIG. 6B is a cross-sectional view taken along the line VIb—VIb shown in FIG. 6A; and FIG. 6C is a cross-sectional view taken along the line VIc—VIc shown in FIG. 6A.

FIG. 7A is a partial plan view; FIG. 7B is a cross-sectional view taken along the line VIIb—VIIb shown in FIG. 7A; and FIG. 7C is a cross-sectional view taken along the line VIIc—VIIc shown in FIG. 7A.

FIG. 8A is a partial plan view; FIG. 8B is a cross-sectional view taken along the line VIIIb—VIIIb shown in FIG. 8A; and FIG. 8C is a cross-sectional view taken along the line VIIIc—VIIIc shown in FIG. 8A.

FIG. 9A is a partial plan view; FIG. 9B is a cross-sectional view taken along the line IXb—IXb shown in FIG. 9A; and FIG. 9C is a cross-sectional view taken along the line IXc—IXc shown in FIG. 9A.

FIG. 10A is a partial plan view; FIG. 10B is a cross-sectional view taken along the line Xb—Xb shown in FIG. 10A; and FIG. 10C is a cross-sectional view taken along the line Xc—Xc shown in FIG. 10A.

FIG. 11A is a partial plan view; FIG. 11B is a cross-sectional view taken along the line XIb—XIb shown in FIG. 11A; and FIG. 11C is a cross-sectional view taken along the line XIc—XIc shown in FIG. 11A.

FIG. 12A is a partial plan view; FIG. 12B is a cross-sectional view taken along the line XIIb—XIIb shown in FIG. 12A; and FIG. 12C is a cross-sectional view taken along the line XIIc—XIIc shown in FIG. 12A.

FIG. 13A is a partial plan view; FIG. 13B is a cross-sectional view taken along the line XIIIb—XIIIb shown in FIG. 13A; and FIG. 13C is a cross-sectional view taken along the line XIIIc—XIIIc shown in FIG. 13A.

FIG. 14A is a partial plan view; FIG. 14B is a cross-sectional view taken along the line XIVb—XIVb shown in FIG. 14A; and FIG. 14C is a cross-sectional view taken along the line XIVc—XIVc shown in FIG. 14A.

FIG. 15A is a partial plan view; FIG. 15B is a cross-sectional view taken along the line XVb—XVb shown in FIG. 15A; and FIG. 15C is a cross-sectional view taken along the line XVc—XVc shown in FIG. 15A.

FIG. 16A is a partial plan view; FIG. 16B is a cross-sectional view taken along the line XVIb—XVIb shown in FIG. 16A; and FIG. 16C is a cross-sectional view taken along the line XVIc—XVIc shown in FIG. 16A.

FIG. 17A is a partial plan view; FIG. 17B is a cross-sectional view taken along the line XVIIb—XVIIb shown in FIG. 17A; and FIG. 17C is a cross-sectional view taken along the line XVIIc—XVIIc shown in FIG. 17A.

FIG. 18A is a partial plan view; FIG. 18B is a cross-sectional view taken along the line XVIIIb—XVIIIb shown in FIG. 18A; and FIG. 18C is a cross-sectional view taken along the line XVIIIc—XVIIIc shown in FIG. 18A.

DESCRIPTION OF THE PREFERRED EMBODIMENTS

Hereinafter, embodiments of the present invention will be described with reference to the accompanying drawings.

Figure 1:
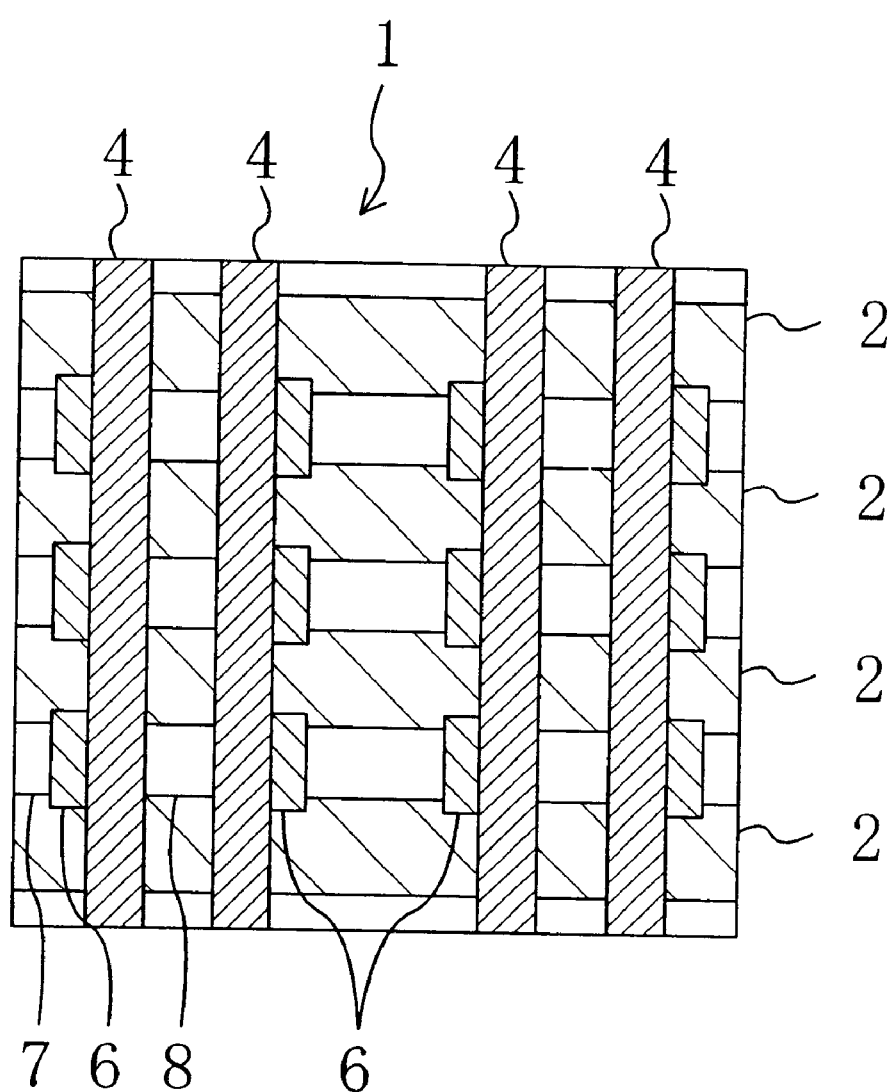
FIG. 1 is a partial plan view illustrating a semiconductor memory device according to an embodiment of the present invention.

FIG. 1 illustrates a planar layout for a semiconductor memory device according to an embodiment of the present invention.

As shown in FIG. 1, multiple control gate electrodes 4 are formed over a semiconductor substrate 1 of silicon (Si) with a gate insulating film (not shown in FIG. 1) interposed between the control gate electrodes 4 and the semiconductor substrate 1. Multiple shallow trench isolations (STIs) 2 are also formed in a striped pattern on the semiconductor substrate 1 so as to be spaced apart from each other in the direction in which the control gate electrodes 4 extend, i.e., in the width direction of the control gate electrodes 4. Each of the STIs 2 crosses all of the control gate electrodes 4.

On a side face of each of the control gate electrodes 4, island-shaped floating gate electrodes 6 are formed for each active region located between adjacent ones of the STIs 2 on the semiconductor substrate 1 with an insulating film (not shown in FIG. 1) interposed between the floating gate electrode 6 and the control gate electrode 4. Each of the floating gate electrodes 6 has its ends in the gate width direction positioned on associated ones of the STIs 2. In this structure, part of the insulating film sandwiched between the control gate electrode 4 and the floating gate electrode 6 will be a capacitance insulating film. Another part of the insulating film sandwiched between the active region and the floating gate electrode 6 will be a tunnel insulating film.

As will be described later, a step region exists in part of the active region under each floating gate electrode 6. Also, a drain region 7 has been defined in another part of the active region closer to the floating gate electrode 6 and a source region 8 has been defined in still another part of the active region opposite to the floating gate electrode 6.

Hereinafter, a method for fabricating a semiconductor memory device having this structure will be described with reference to the accompanying drawings.

FIGS. 2A through 9C illustrate respective process steps for fabricating the semiconductor memory device of this embodiment. In each of these drawings, A illustrates a partial planar layout of the structure, B illustrates a cross-sectional view of the structure shown in A including an active region and C illustrates a cross-sectional view of the structure shown in A including an STI.

Figure 2A:
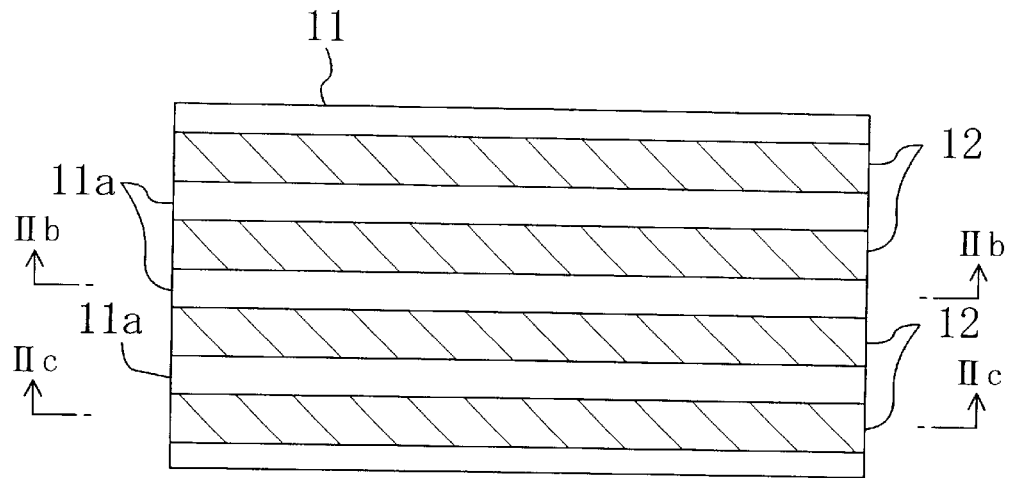
FIGS. 2A, 2B and 2C illustrate a method for fabricating the semiconductor memory device shown in FIG. 1.
Figure 2B:
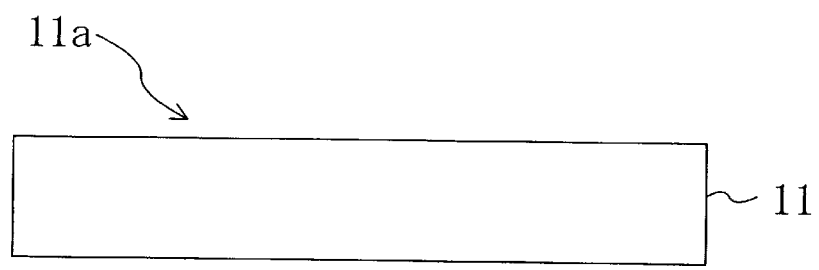
Figure 2C:
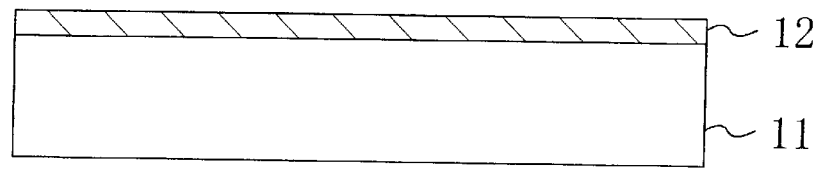

First, as shown in FIGS. 2A, 2B and 2C, multiple STIs 12 are formed in a striped pattern on a semiconductor substrate 11 of silicon so as to be spaced apart from each other. In this manner, active regions 11a, isolated from each other by the STIs 12, are defined in a striped pattern on the semiconductor substrate 11.

Figure 3A:
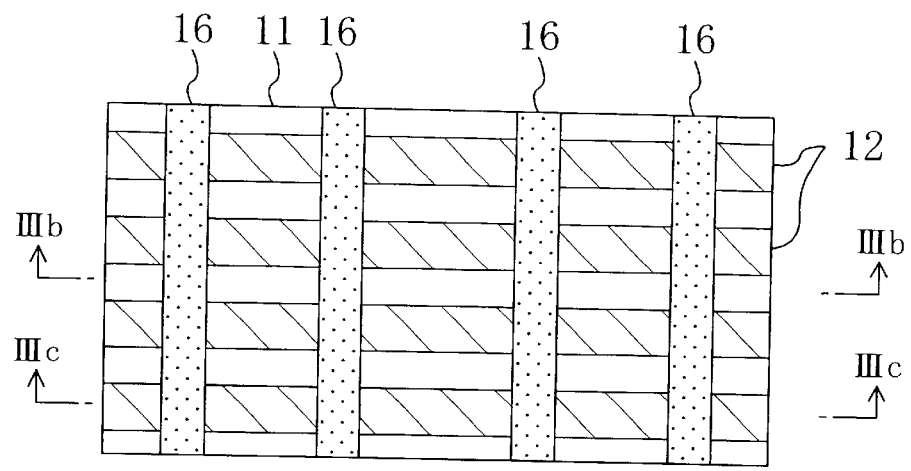
FIGS. 3A, 3B and 3C illustrate a method for fabricating the semiconductor memory device shown in FIG. 1.
Figure 3B:
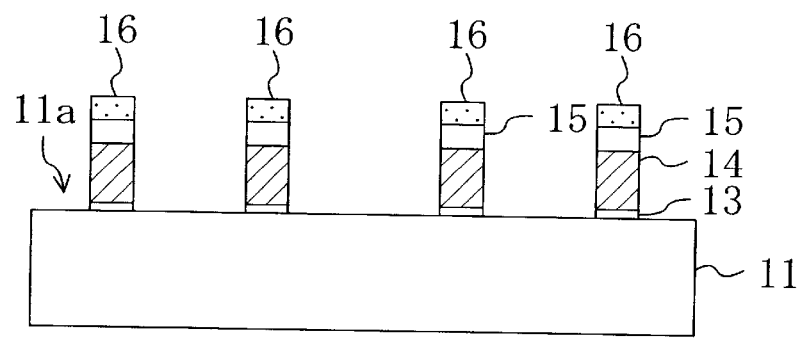
Figure 3C:
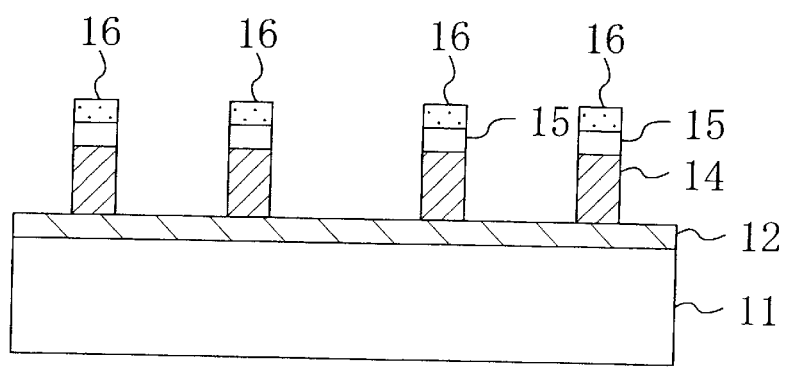

Next, as shown in FIGS. 3A, 3B and 3C, the exposed surface of the semiconductor substrate 11 is thermally oxidized, thereby forming a first silicon dioxide film, which has a thickness of about 9 nm, over the semiconductor substrate 11. Then, a first polysilicon film and a silicon nitride film 15 are deposited by a CVD process in this order on the first silicon dioxide film to about 200 nm and about 150 nm, respectively. Then, a mask pattern 16 for forming control gate electrodes is defined by a photolithographic process, and the silicon nitride film 15, the first polysilicon film and the first silicon dioxide film are dry-etched using the mask pattern 16. In this manner, control gate electrodes 14 are formed out of the first polysilicon film and control gate insulating films 13 are formed out of the first silicon dioxide film.

Figure 4A:
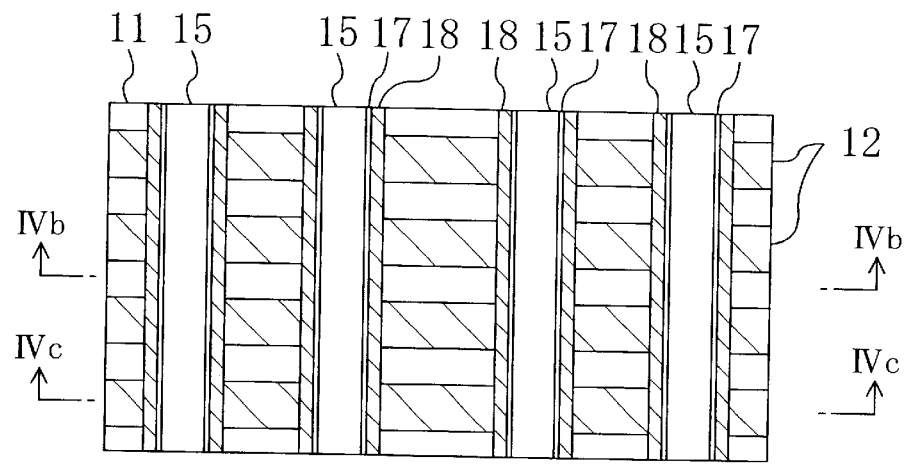
FIGS. 4A, 4B and 4C illustrate a method for fabricating the semiconductor memory device shown in FIG. 1.
Figure 4B:
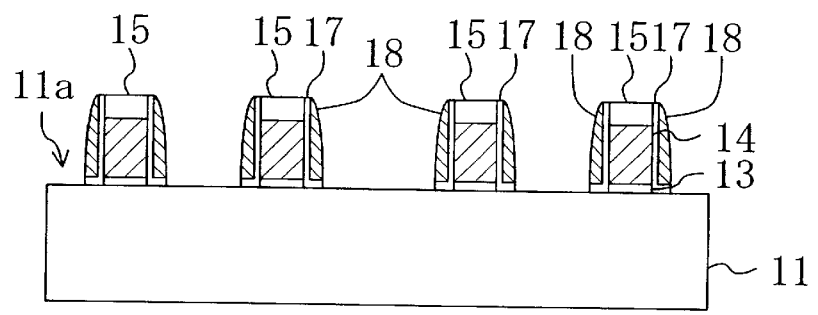
Figure 4C:
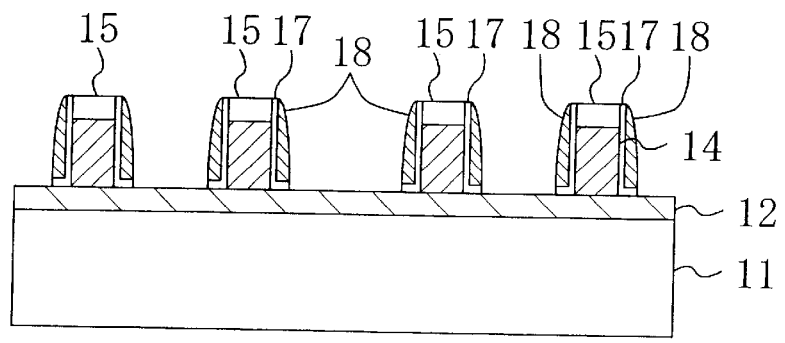

Next, as shown in FIGS. 4A, 4B and 4C, after the mask pattern 16 has been removed, an HTO (high temperature oxide) film and a silicon nitride film are deposited by a CVD process to about 5 nm and about 10 nm, respectively, over the semiconductor substrate 11 as well as over the control gate electrodes 14 and the silicon nitride films 15. In this manner, capacitance insulating films 17 are formed. Then, a BPSG film made of a silicon dioxide containing boron and phosphorus is deposited over the semiconductor substrate 11. Subsequently, the BPSG film is dry-etched, thereby forming sidewall insulating films 18 out of the BPSG film on the side faces of the control gate electrodes 14.

Figure 5A:
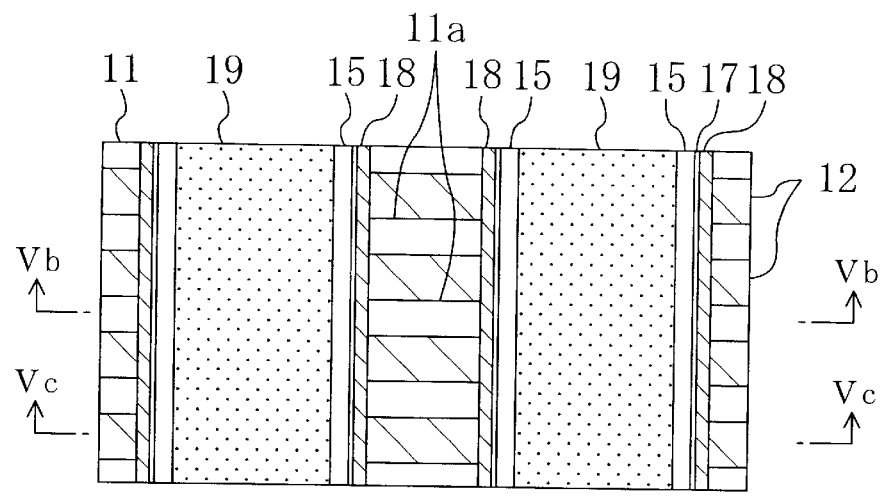
FIGS. 5A, 5B and 5C illustrate a method for fabricating the semiconductor memory device shown in FIG. 1.
Figure 5B:
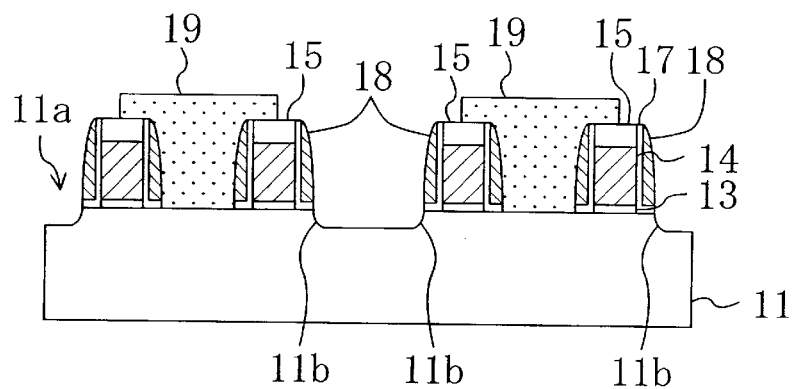
Figure 5C:
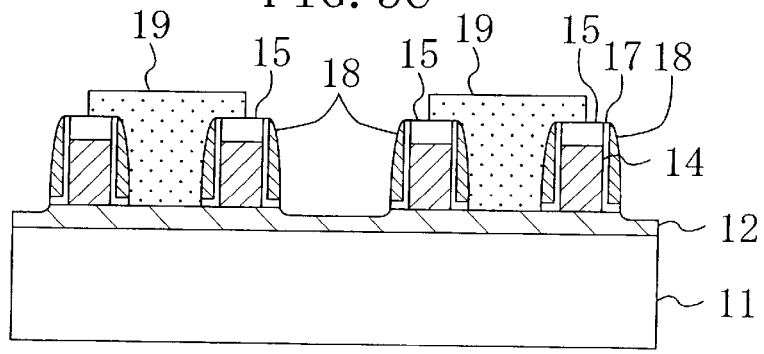

Next, as shown in FIGS. 5A, 5B and 5C, a mask pattern 19, which exposes the drain forming regions of the active regions 11a in the gate width direction of the control gate electrodes 14, is defined over the substrate 11 by a photolithographic process for the purpose of forming the step regions. Then, the semiconductor substrate 11 is dry-etched isotropically using the mask pattern 19, the silicon nitride films 15 and the sidewall insulating films 18 as a mask, thereby forming step regions 11b to a depth of about 40 nm in the drain forming regions of the semiconductor substrate 11.

Figure 6A:
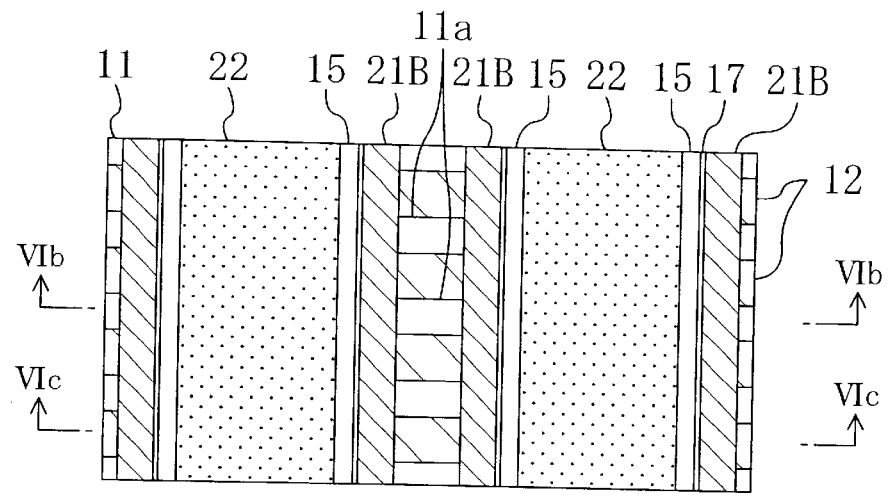
FIGS. 6A, 6B and 6C illustrate a method for fabricating the semiconductor memory device shown in FIG. 1.
Figure 6B:
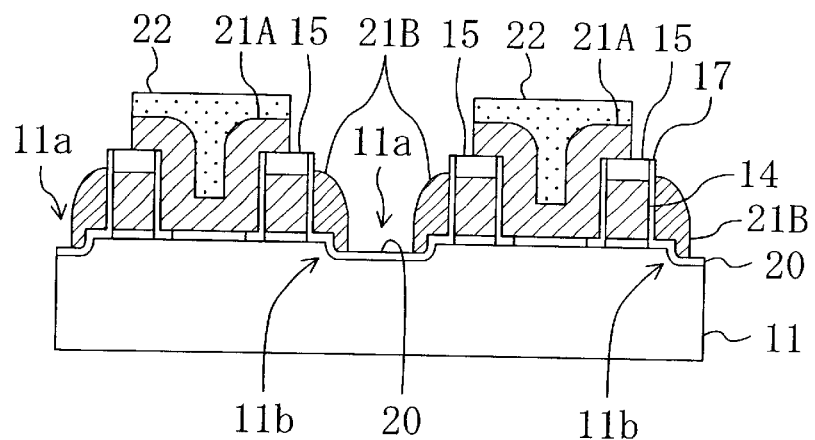
Figure 6C:
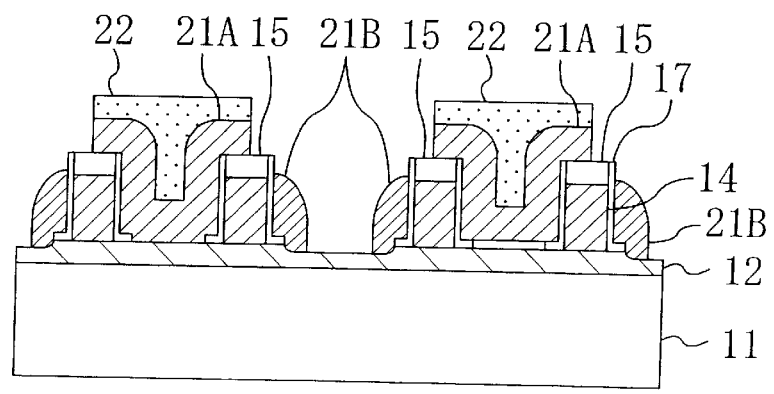

Next, as shown in FIGS. 6A, 6B and 6C, after the mask pattern 19 has been removed, an etching process using vapor phase hydrogen fluoride is carried out to remove the sidewall insulating films 18. Subsequently, the step regions 11b have their surface thermally oxidized, thereby forming tunnel insulating films 20 of silicon dioxide. Thereafter, a second polysilicon film 21A is deposited by a CVD process to a thickness of about 100 nm over the semiconductor substrate 11 as well as over the control gate electrodes 14 and the silicon nitride films 15. Then, a mask pattern 22, which exposes the drain forming regions of the active regions 11a and the STIs 12 in the gate width direction of the control gate electrodes 14, is defined by a photolithographic process on the second polysilicon film 21A. Thereafter, the second polysilicon film 21A is dry-etched anisotropically using the mask pattern 22 and the silicon nitride films 15 as a mask, thereby forming sidewall-shaped polysilicon films 21B overlapping the step regions 11b out of the second polysilicon film 21A.

Figure 7A:
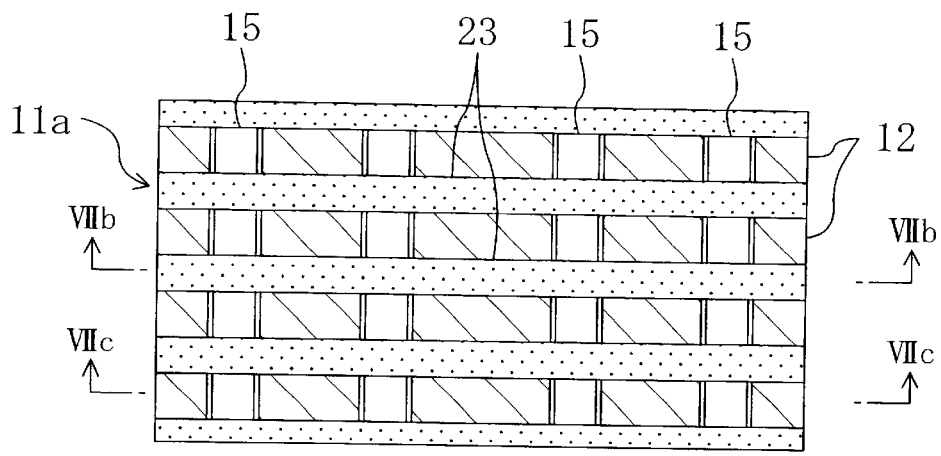
FIGS. 7A, 7B and 7C illustrate a method for fabricating the semiconductor memory device shown in FIG. 1.
Figure 7B:
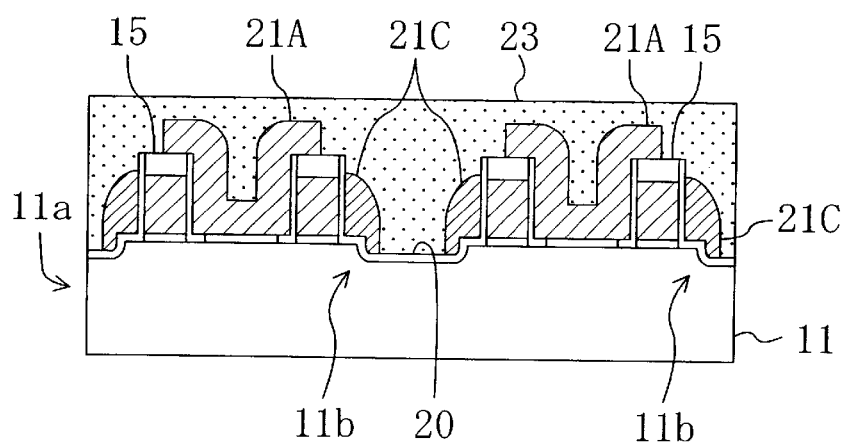
Figure 7C:
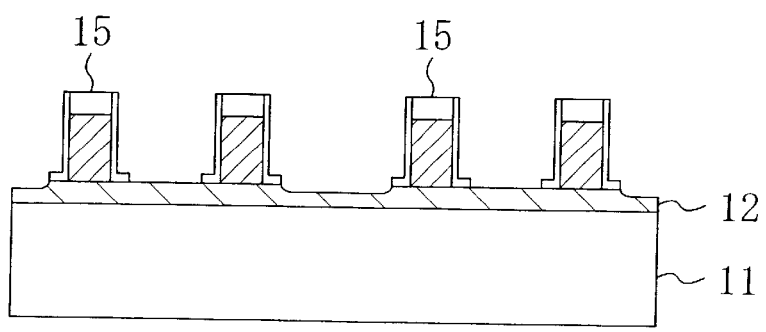

Next, as shown in FIGS. 7A, 7B and 7C, after the mask pattern 22 has been removed, a mask pattern 23, which exposes the STIs 12 (i.e., masks the active regions 11a), is defined by a photolithographic process over the semiconductor substrate 11. Subsequently, the second polysilicon film 21A and the sidewall-shaped polysilicon films 21B are dry-etched anisotropically using the mask pattern 23. In this manner, island-shaped floating gate electrodes 21C, overlapping the step regions 11b, are formed out of the sidewall-shaped polysilicon films 21B in the drain forming regions of the active regions 11a. Each of the floating gate electrodes 21C has its ends in the gate width direction positioned on associated ones of the STIs 12. That is to say, multiple floating gate electrodes 21C are formed for each control gate electrode.

Figure 8A:
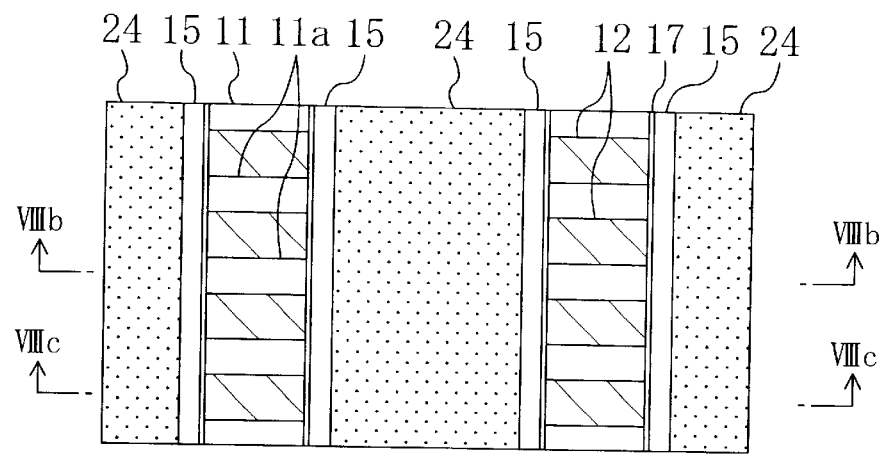
FIGS. 8A, 8B and 8C illustrate a method for fabricating the semiconductor memory device shown in FIG. 1.
Figure 8B:
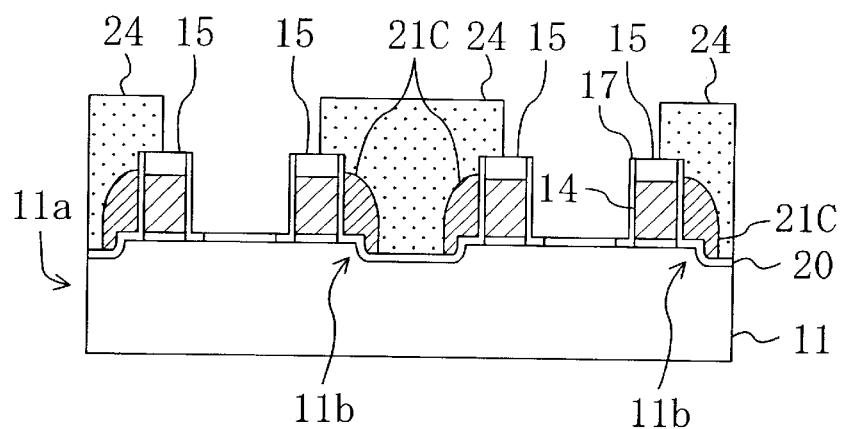
Figure 8C:
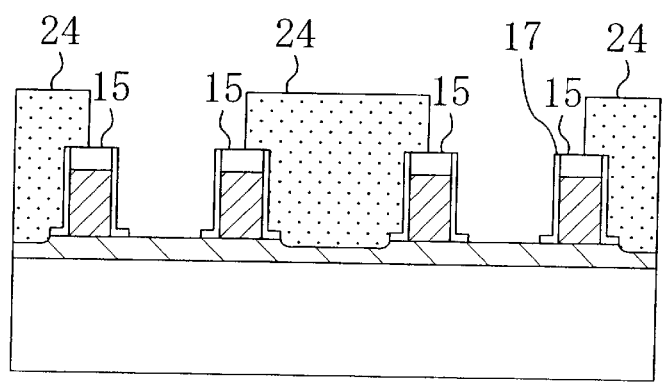

Next, as shown in FIGS. 8A, 8B and 8C, after the mask pattern 23 has been removed, a mask pattern 24, which exposes the source forming regions of the active regions 11a and the STIs 12 in the gate width direction of the control gate electrodes 14, is defined by a photolithographic process. Then, an isotropic dry etching process is carried out using the mask pattern 24 and the silicon nitride films 15 as a mask to remove the remaining parts of the second polysilicon film 21A located over the source forming regions.

The process step of removing those parts of the second polysilicon film 21A and the sidewall-shaped polysilicon films 21B from over the STIs 12 as shown in FIGS. 7A, 7B and 7C and the process step of removing the remaining parts of the second polysilicon film 21A from over the source forming regions as shown in FIGS. 8A, 8B and 8C may be carried out in reverse order.

Figure 9A:
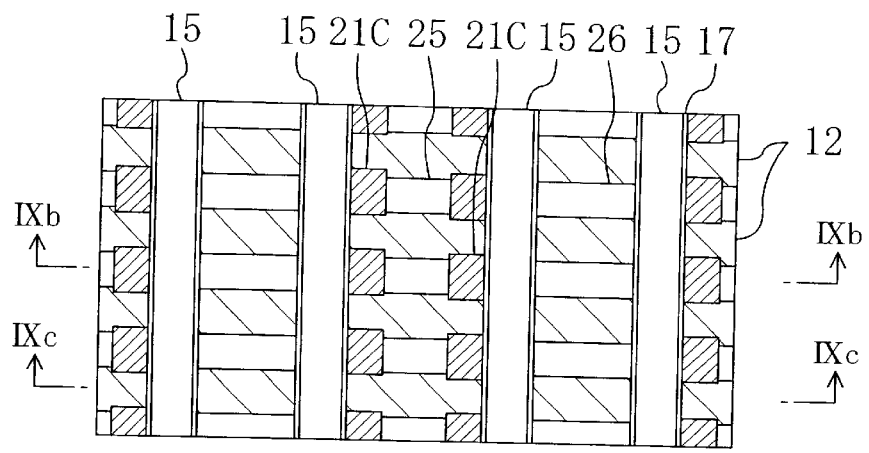
FIGS. 9A, 9B and 9C illustrate a method for fabricating the semiconductor memory device shown in FIG. 1.
Figure 9B:
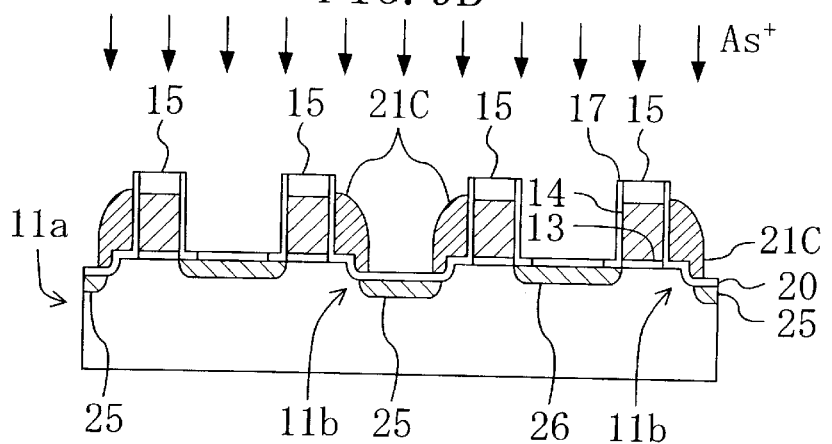
Figure 9C:
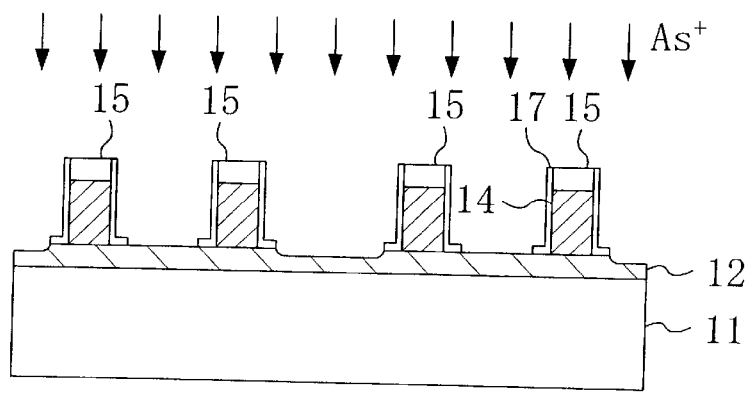
Figure 10A:
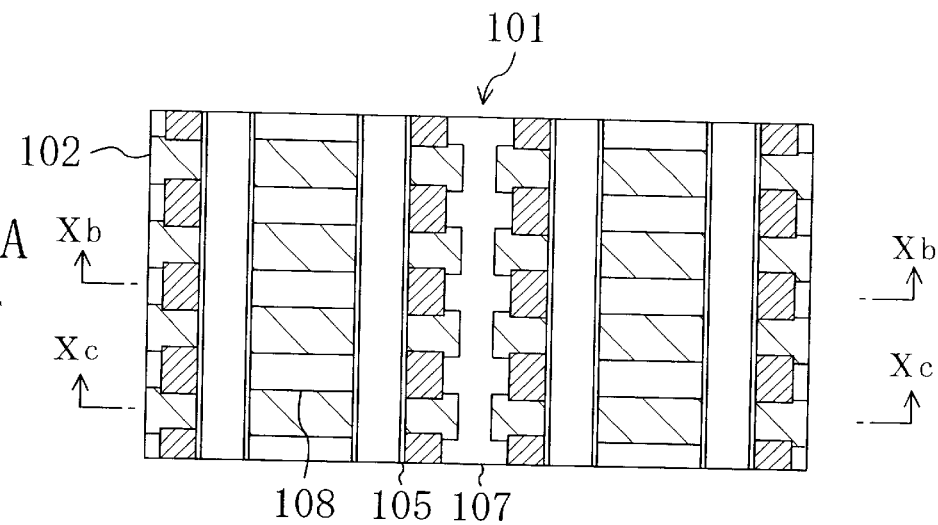
FIGS. 10A, 10B and 10C illustrate the known semiconductor memory device.
Figure 10B:
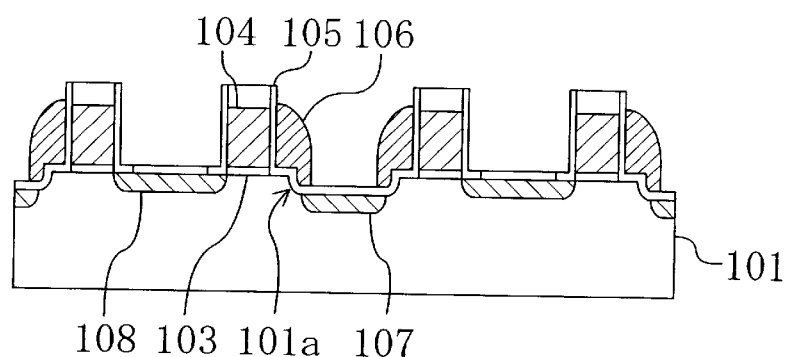
Figure 10C:
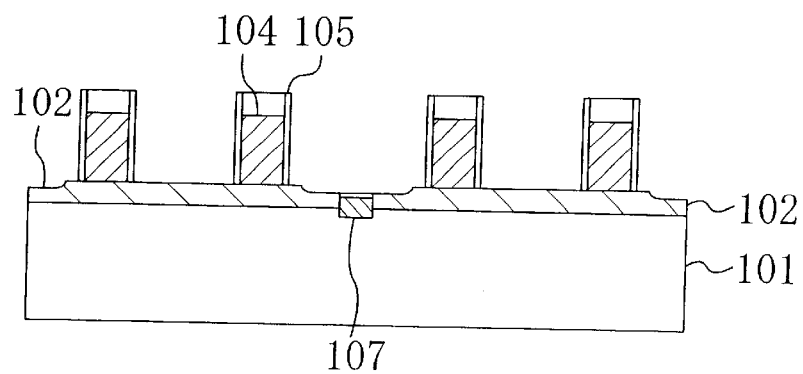
Figure 11A:
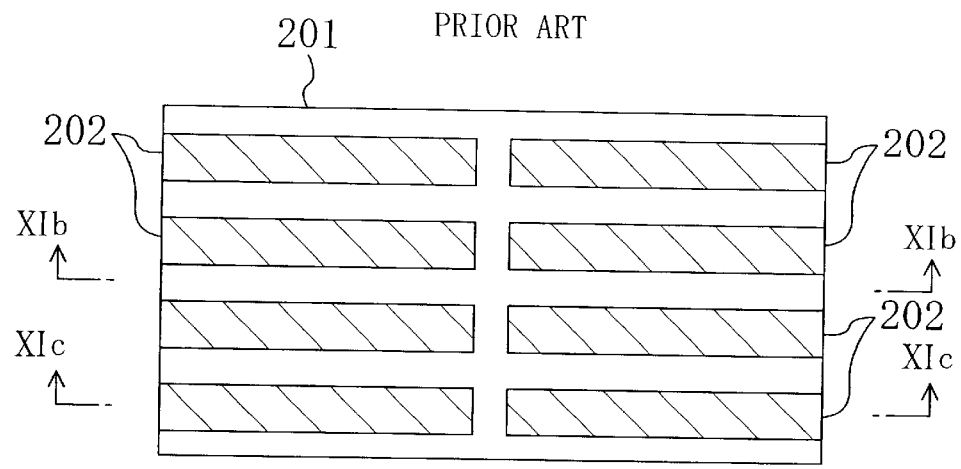
FIGS. 11A, 11B and 11C illustrate a method for fabricating the semiconductor memory device shown in FIG. 10.
Figure 11B:
Figure 11C:
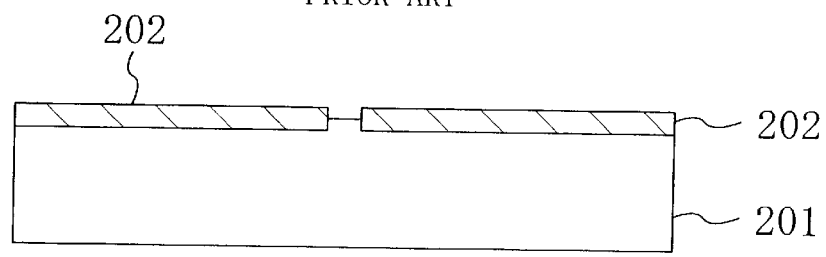
Figure 12A:
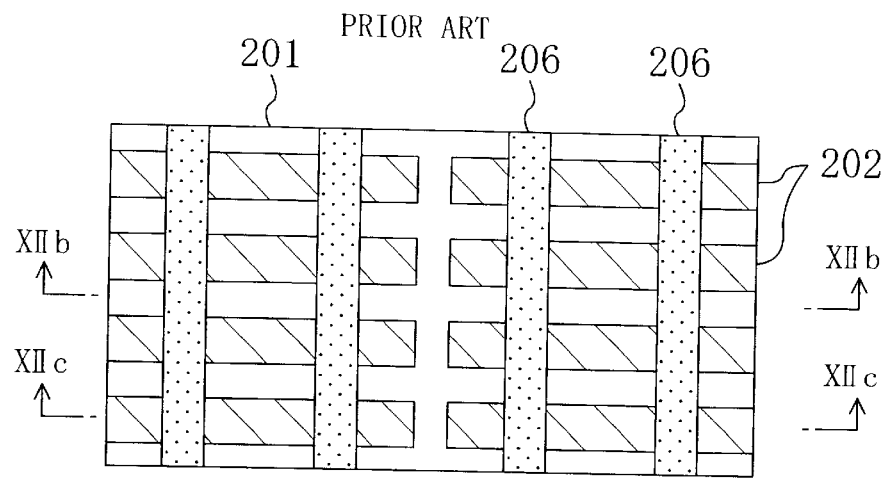
FIGS. 12A, 12B and 12C illustrate a method for fabricating the semiconductor memory device shown in FIG. 10.
Figure 12B:
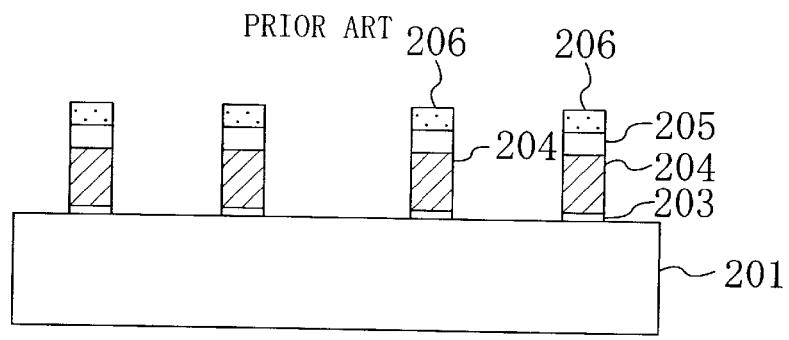
Figure 12C:
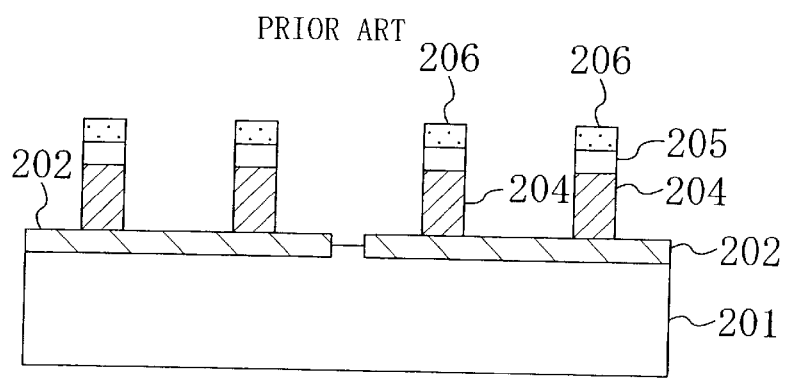
Figure 13A:
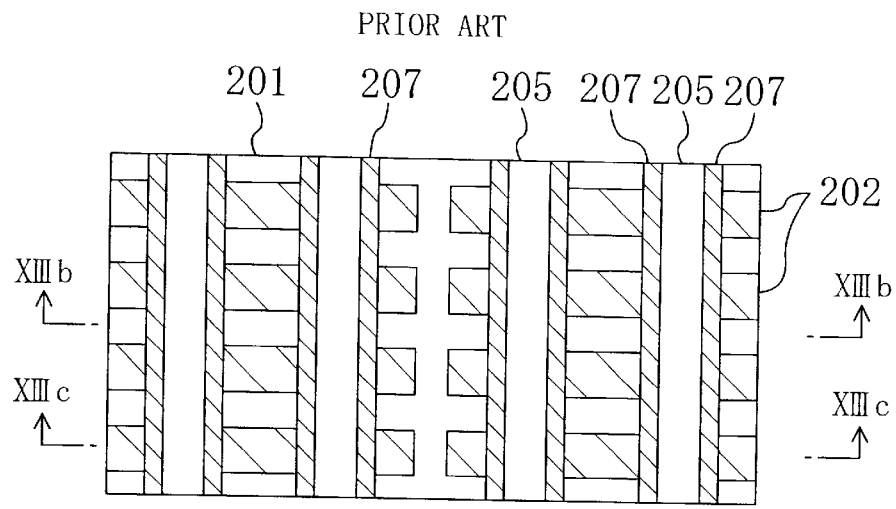
FIGS. 13A, 13B and 13C illustrate a method for fabricating the semiconductor memory device shown in FIG. 10.
Figure 13B:
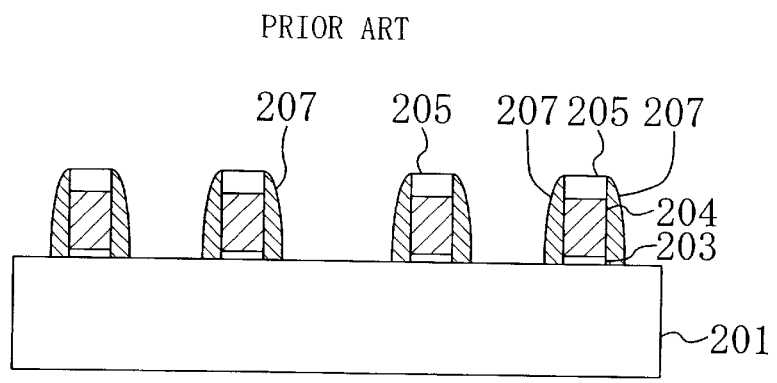
Figure 13C:
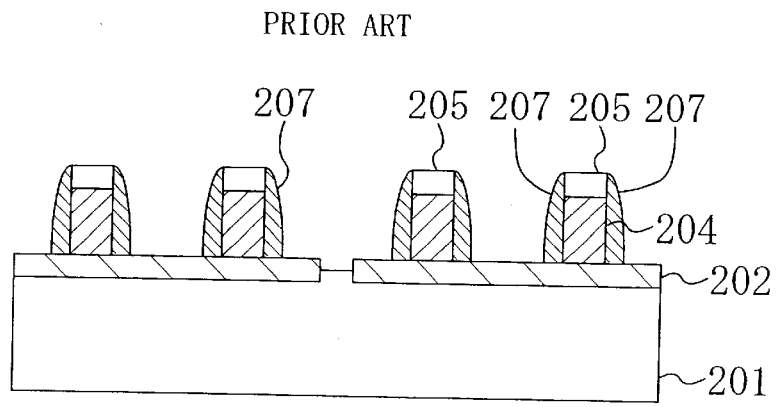
Figure 14A:
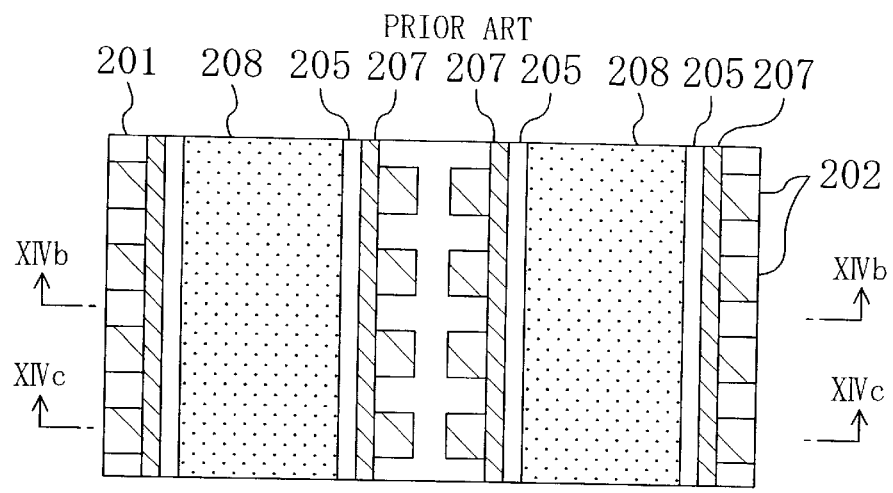
FIGS. 14A, 14B and 14C illustrate a method for fabricating the semiconductor memory device shown in FIG. 10.
Figure 14B:
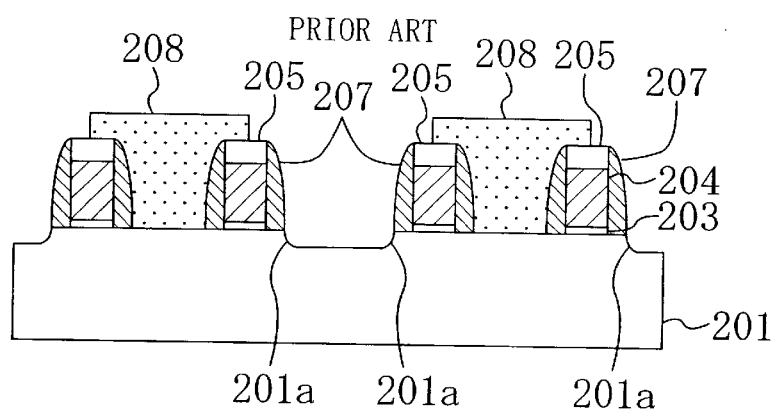
Figure 14C:
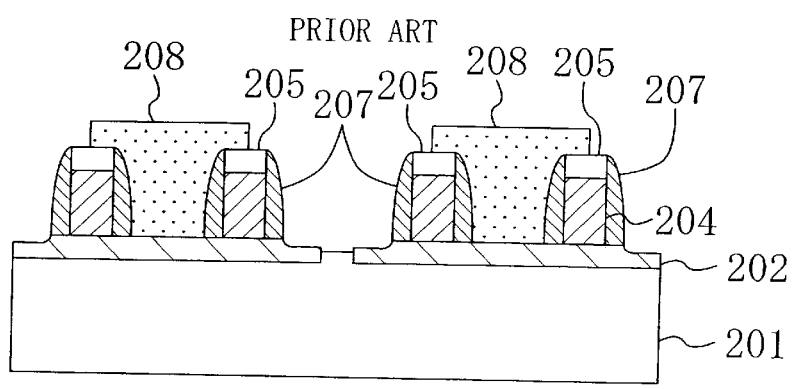
Figure 15A:
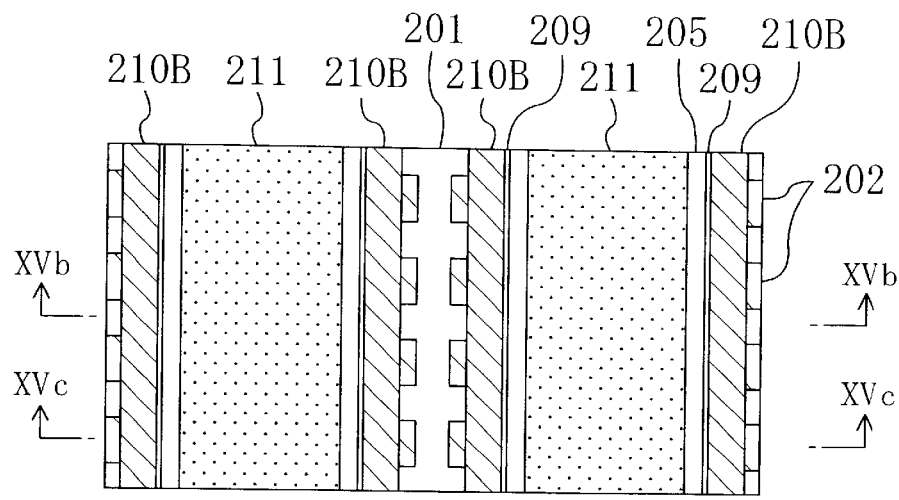
FIGS. 15A, 15B and 15C illustrate a method for fabricating the semiconductor memory device shown in FIG. 10.
Figure 15B:
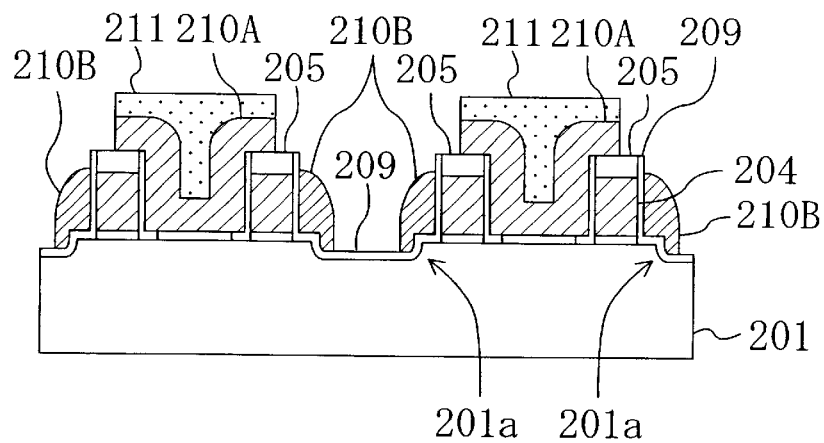
Figure 15C:
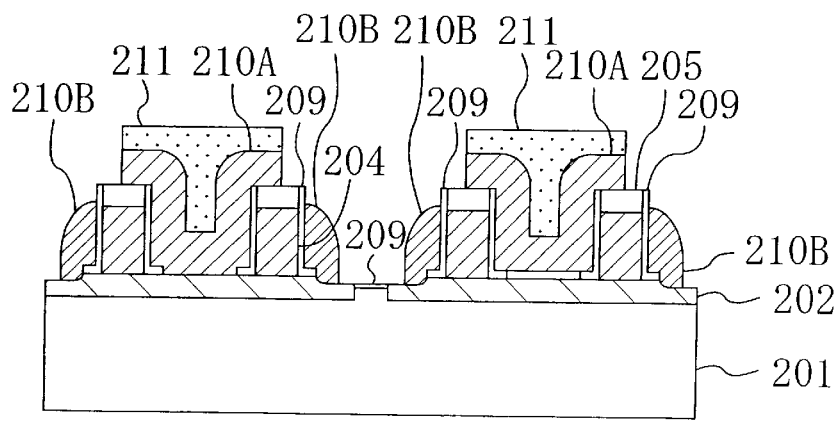
Figure 16A:
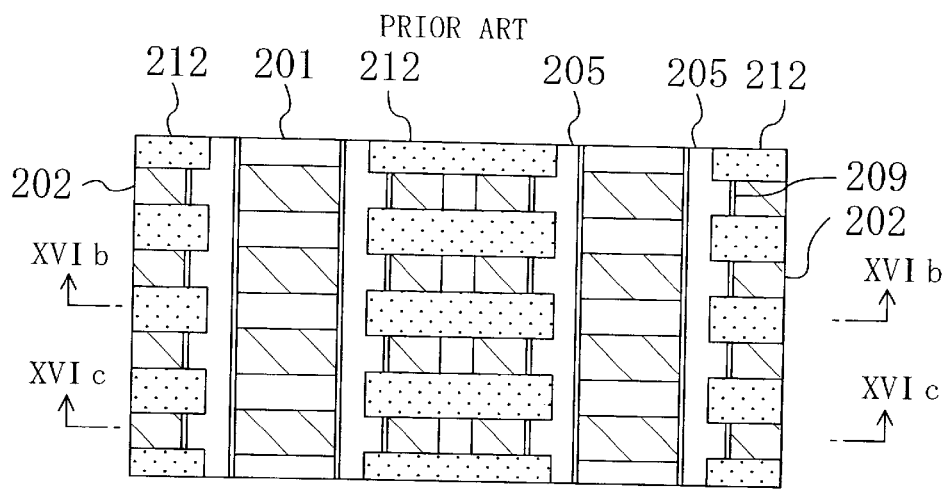
FIGS. 16A, 16B and 16C illustrate a method for fabricating the semiconductor memory device shown in FIG. 10.
Figure 16B:
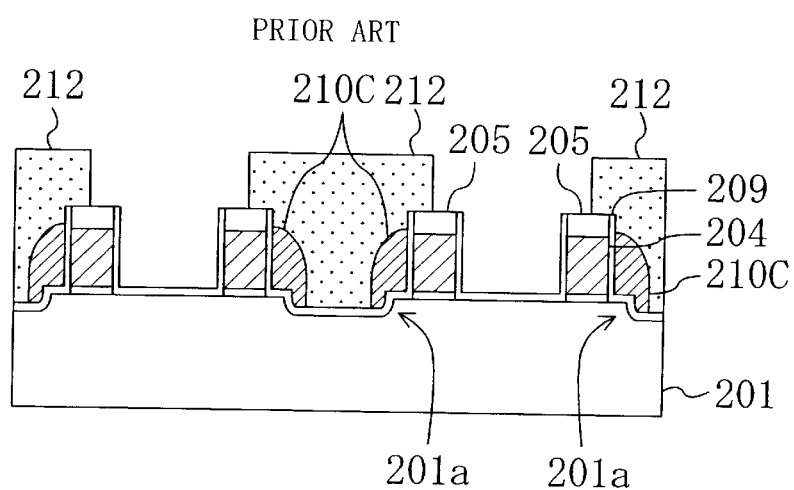
Figure 16C:
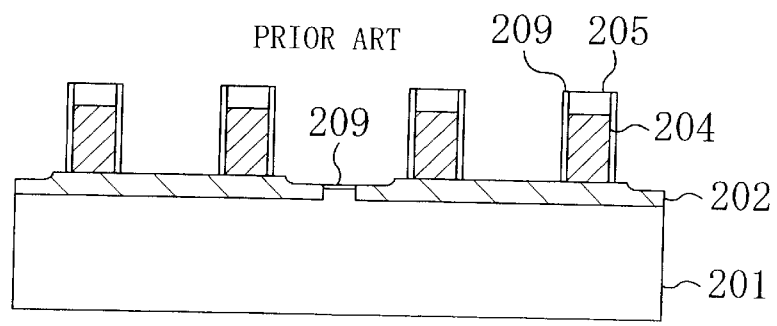
Figure 17A:
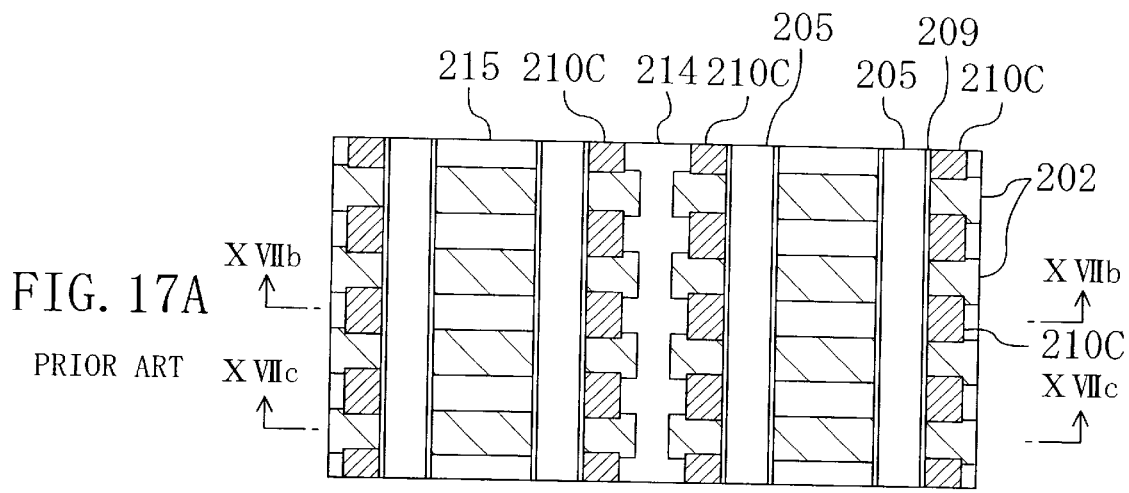
FIGS. 17A, 17B and 17C illustrate a method for fabricating the semiconductor memory device shown in FIG. 10.
Figure 17B:
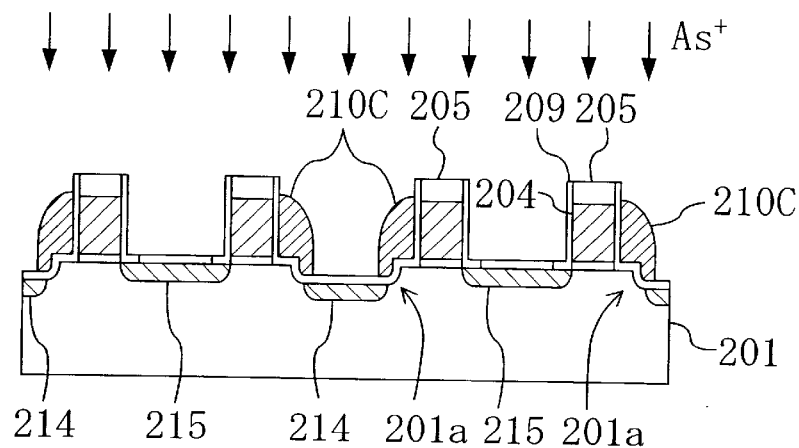
Figure 17C:
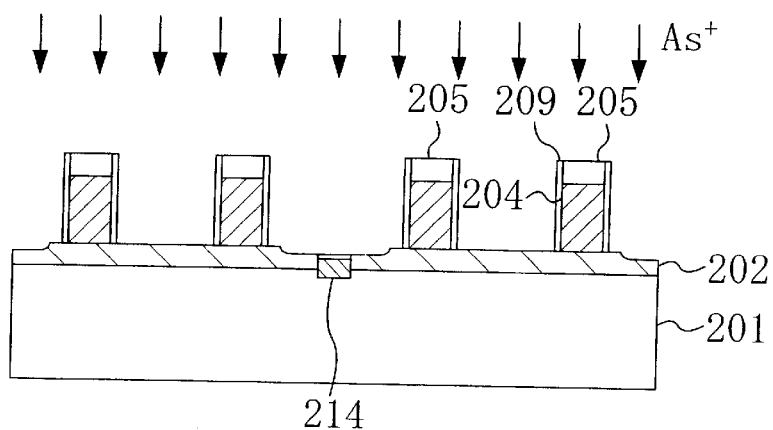
Figure 18A:
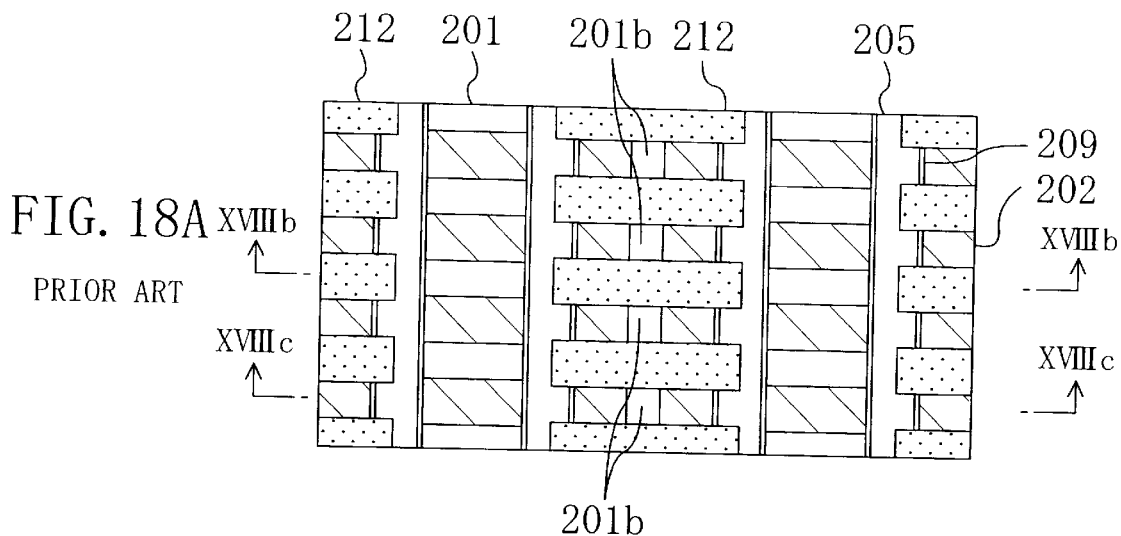
FIGS. 18A, 18B and 18C illustrate how the doped regions are disconnected in the known method for fabricating the semiconductor memory device shown in FIG. 10.
Figure 18B:
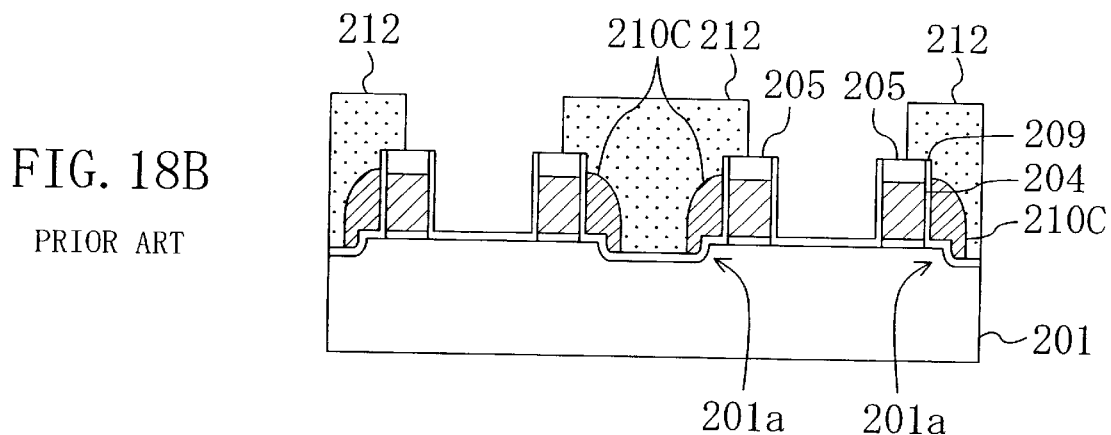
Figure 18C:
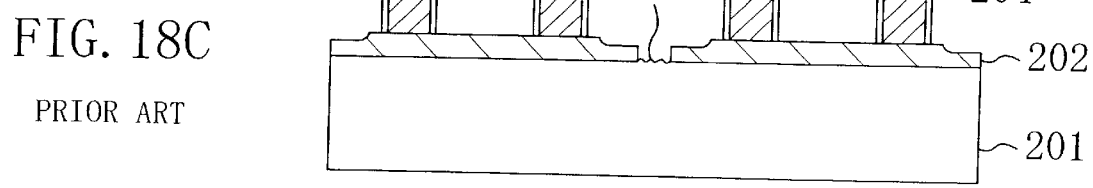
Figure 19:
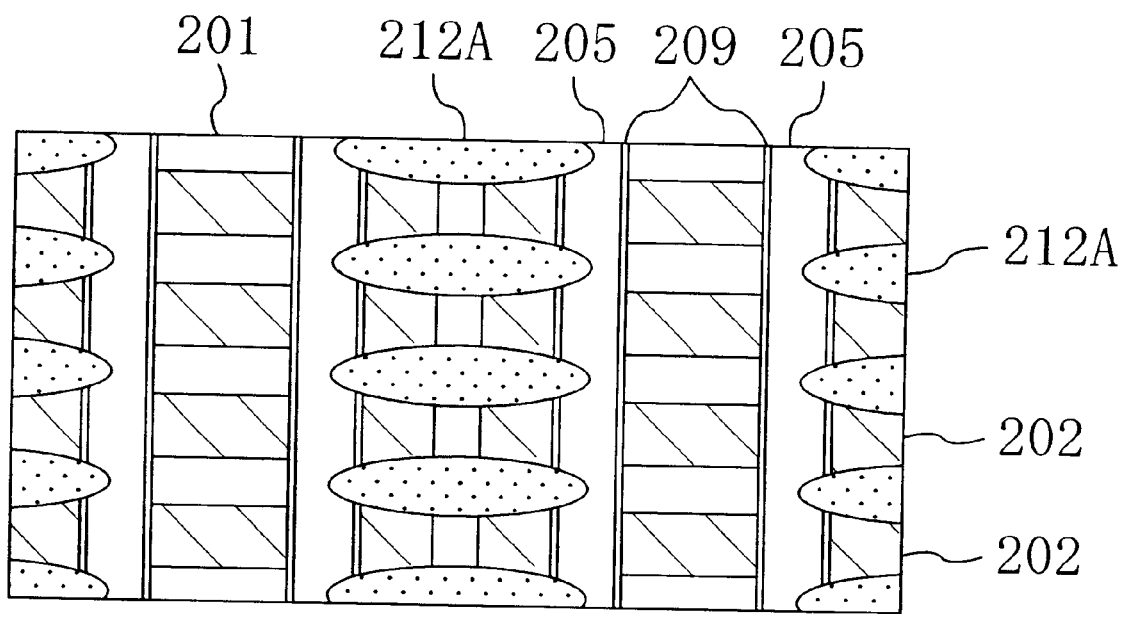
FIG. 19 is a plan view schematically illustrating how the mask pattern has its corners rounded and its size accuracy deteriorated in the known method for fabricating the semiconductor memory device shown in FIG. 10.

Next, as shown in FIGS. 9A, 9B and 9C, after the mask pattern 24 has been removed, arsenic (As) ions are implanted into the semiconductor substrate 11 at a dose of $6 \times 10^{15}/cm^2$ and with an acceleration voltage of 40 keV applied using the silicon nitride films 15 and the floating gate electrodes 21C as a mask. In this manner, drain regions 25 are defined in the drain forming regions and source regions 26 are defined in the source forming regions.

Thereafter, other fabrication process steps such as metalization, passivation film forming and bonding pad forming process steps are carried out.

In this embodiment, the STIs 12 for isolating adjacent ones of the memory cells from each other in the gate width direction of the control gate electrodes 14 are formed in a striped pattern on the semiconductor substrate 11. That is to say, the STIs 12 are spaced apart from each other in the gate width direction. Also, each of the STIs 12 crosses all of the control gate electrodes 14 and extends continuously in the gate length direction of the gate electrodes 14. Thus, as shown in FIG. 7C, when those parts of the second polysilicon film 21A and the sidewall-shaped polysilicon films 21B are etched away from over the STIs 12, the exposed tunnel insulating film 20 should not break and the semiconductor substrate 11 should no longer be etched unintentionally. Therefore, no doped region should be disconnected.

Furthermore, the second polysilicon film 21A for forming the floating gate electrodes 21C is not patterned at a time in a single process step. Specifically, parts of the second polysilicon film 21A and the sidewall-shaped polysilicon films 21B are removed from over the STIs 12 in the process step shown in FIGS. 7A, 7B and 7C. Subsequently, the remaining parts of the second polysilicon film 21A are removed from over the source forming regions in the process step shown in FIGS. 8A, 8B and 8C. Accordingly, when those parts of the second polysilicon film 21A and the sidewall-shaped polysilicon films 21B are etched away from over the STIs 12, the active regions 11a and members located over the regions 11a can be masked continuously in the gate length direction. Thus, the mask pattern 23 does not have to be an isolated one. Therefore, there is no need to worry about the rounding of the corners of the mask pattern 23. Then, a margin that should be allowed for the mask pattern can be reduced. As a result, each of the STIs 12 can have its size reduced in the gate width direction of the control gate electrodes 14, and therefore the area of each cell can be reduced.

Accordingly, in the semiconductor memory device and its fabrication process according to this embodiment, the size accuracy of the mask pattern can be improved, and thus the total cell area can be reduced. Therefore, a semiconductor memory device, including floating and control gate electrodes that are formed side by side on a semiconductor substrate, can have its size reduced and its performance enhanced greatly.

What is claimed is:

1. A method for fabricating a semiconductor memory device, comprising the steps of:

a) forming a plurality of isolations on a semiconductor substrate, thereby defining a plurality of active regions, which have been isolated from each other by the isolations, on the semiconductor substrate;

b) forming a first insulating film and a first conductive film in this order over the semiconductor substrate and then selectively etching the first conductive film, thereby forming a control gate electrode out of the first conductive film so that the control gate electrode crosses all of the isolations and all of the active regions;

c) forming a second insulating film and a second conductive film in this order over the semiconductor substrate as well as over the isolations and the control gate electrode and then selectively etching parts of the second conductive film, thereby forming floating gate electrodes out of the second conductive film for the active regions so that the floating gate electrodes cover a side face of the control gate electrode; and d) implanting ions into the semiconductor substrate using the control gate electrode and the floating gate electrodes as a mask, thereby defining source and drain regions in each said active region, wherein the step c) includes:

forming and selectively etching the second conductive film to form a sidewall-shaped conductive film out of the second conductive film on the side face of the control gate electrode;

removing parts of the sidewall-shaped conductive film and parts of the second conductive film from over the isolations, thereby forming the floating gate electrodes on the side face of the control gate electrode as islands out of the sidewall-shaped conductive film which are separated from each other on the isolations; and removing remaining parts of the second conductive film from upper and another side faces of the control gate electrode.

2. The method of claim 1, wherein the step a) comprises forming the isolations in a striped pattern on the semiconductor substrate so that the isolations are spaced apart from each other along the width of the control gate electrode.

3. The method of claim 1, wherein the step b) comprises forming a third insulating film on the first conductive film and then etching the third insulating film and the first conductive film.

4. The method of claim 1, wherein the step c) comprises:

forming a sidewall insulating film on side faces of the control gate electrode with the second insulating film interposed between the sidewall insulating film and the control gate electrode; and etching parts of the semiconductor substrate, which parts are located below the side face of the control gate electrode, using the sidewall insulating film as a mask, thereby forming a plurality of step regions for the active regions.

5. The method of claim 1, wherein the formation of the floating gate electrodes on the active regions is such that the floating gate electrodes are separated from each other on the isolations provided on the side face of the control gate electrode.

* * * * *